(12) United States Patent
Lin et al.

(10) Patent No.: US 11,515,222 B2
(45) Date of Patent: Nov. 29, 2022

(54) SEMICONDUCTOR ASSEMBLIES WITH FLOW CONTROLLER TO MITIGATE INGRESSION OF MOLD MATERIAL

(71) Applicant: Micron Technology, Inc., Boise, ID (US)

(72) Inventors: Lu Fu Lin, Taichung (TW); Yung Sheng Zou, Taichung (TW); Chong Leong Gan, Taichung (TW); Li Jao, Taichung (TW); Min Hua Chung, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/139,073

(22) Filed: Dec. 31, 2020

(65) Prior Publication Data
US 2022/0208625 A1 Jun. 30, 2022

(51) Int. Cl.
| H01L 25/00 | (2006.01) |
| H01L 23/24 | (2006.01) |
| H01L 25/065 | (2006.01) |
| H01L 25/18 | (2006.01) |
| H01L 21/56 | (2006.01) |

(52) U.S. Cl.
CPC .............. *H01L 23/24* (2013.01); *H01L 21/56* (2013.01); *H01L 25/0652* (2013.01); *H01L 25/18* (2013.01); *H01L 25/50* (2013.01)

(58) Field of Classification Search
CPC ...... H01L 23/24; H01L 21/56; H01L 25/0652
See application file for complete search history.

(56) References Cited

U.S. PATENT DOCUMENTS

| 8,035,205 | B2 * | 10/2011 | Park | H01L 21/565 257/667 |
| 8,560,141 | B2 * | 10/2013 | Shah | G06F 1/206 700/299 |
| 9,997,434 | B2 * | 6/2018 | Kumari | H01L 25/0657 |
| 10,410,694 | B1 * | 9/2019 | Arbel | G11C 5/025 |

* cited by examiner

*Primary Examiner* — Thao P Le
(74) *Attorney, Agent, or Firm* — Perkins Coie LLP

(57) ABSTRACT

Semiconductor devices having flow controllers configured to reduce mitigation of mold material between stacked layers, and associated systems and methods, are disclosed herein. In some embodiments, the semiconductor device includes a package substrate that has first and second surfaces. First and second die stacks are formed on the first surface and are adjacent to each other. A portion of the first surface extends between the first and second die stacks. A layer of material is adhered to top surfaces of the first and second die stacks and extends at a distance above the package substrate to form a tunnel between the layer of material, opposing sidewalls of the die stacks, and the package substrate. The semiconductor device further includes a flow controller that is adhered to at least a portion of the first surface inside the tunnel that reduces a cross-sectional surface area of at least a portion of the tunnel.

13 Claims, 6 Drawing Sheets

SEMICONDUCTOR ASSEMBLIES WITH FLOW CONTROLLER TO MITIGATE INGRESSION OF MOLD MATERIAL

TECHNICAL FIELD

The present technology is directed to semiconductor manufacturing. More particularly, some embodiments of the present technology relate to techniques for protecting sidewalls of adjacent vertical stacks of semiconductor dies during the molding process.

BACKGROUND

Packaged semiconductor dies, such as memory chips, microprocessor chips, and imager chips, typically include a semiconductor die mounted on a substrate and encased in a protective covering. The semiconductor die can include functional features, such as memory cells, processor circuits, and imager devices.

Market pressures drive semiconductor manufacturers to reduce the size of die packages to fit within the space constraints of electronic devices, while also increasing the functional capacity of each package. One approach for increasing the processing power of a semiconductor package without substantially increasing the surface area covered by the package (the package's "footprint") is to form die stacks by vertically stacking multiple semiconductor dies on top of one another in a single package. The die stacks can be formed adjacent one another with a space therebetween. One or more layers can extend over the top of adjacent die stacks, forming an opening or "tunnel" between the die stacks. When applying a protective coating to encapsulate the semiconductor package, mold material flows into and completely fills the tunnel. Conventional techniques for applying the protective coating can result in ingression of the mold material between layers within the tunnel, which may result in delamination and failure of one or more functions of the die package, effectively lowering the reliability and yield.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
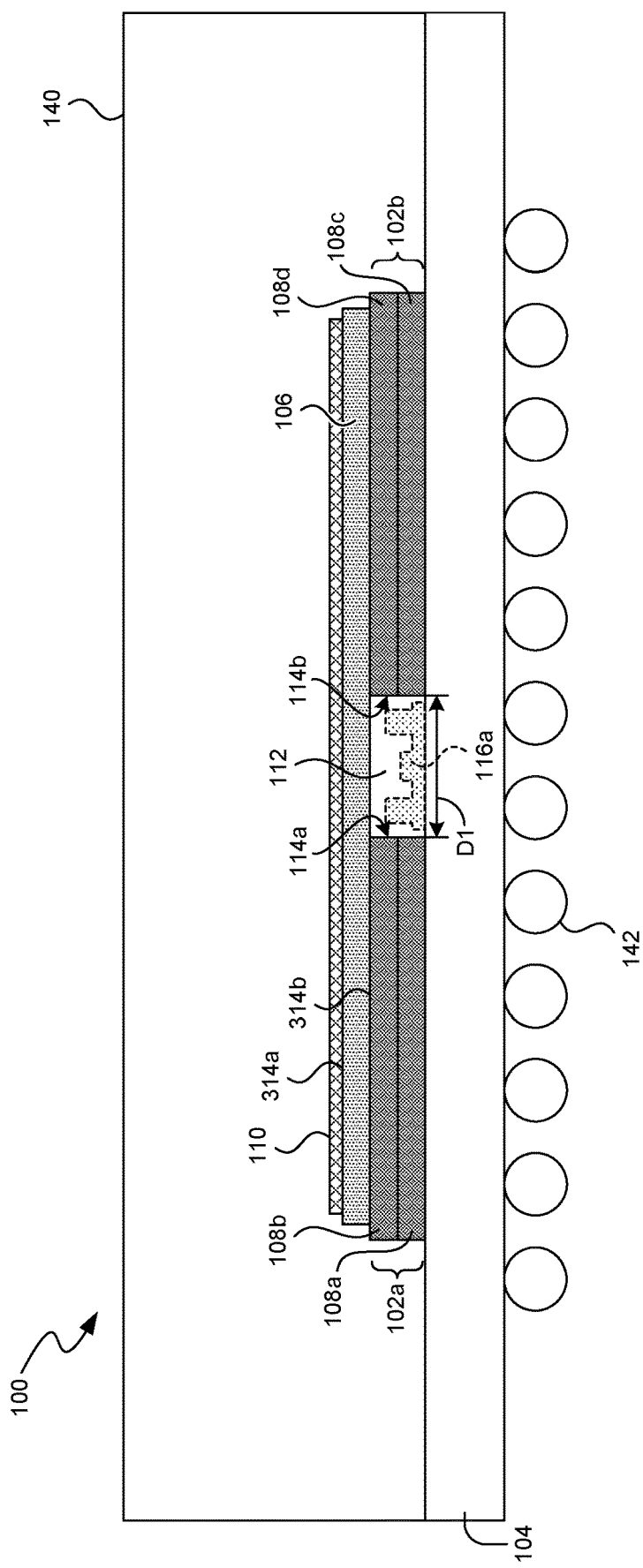
FIG. 1A is a side cross-sectional view of a semiconductor package configured in accordance with embodiments of the present technology.

Specific details of several embodiments of semiconductor devices are described below. In some embodiments, a semiconductor device can include one or more flow controller mounted or formed on a surface, such as a package substrate. Die stacks are mounted or formed on the surface next to or proximate the flow controller. A layer of material can be mounted to extend over at least some of the die stacks, forming tunnels between adjacent die stacks. The flow controller reduces the cross-sectional surface area within at least portions of the tunnel. When mold material is applied to encapsulate the semiconductor device, the flow controller is configured to reduce fluid pressure and increase fluid velocity of the mold material as it flows along sidewalls of the tunnel. In contrast to devices that do not include a flow controller within the tunnel between the die stacks, the devices described herein can reduce the fluid pressure along the sidewalls to mitigate or eliminate the incursion of mold material into layers between dies in the die stacks, as well as between the dies and the package substrate and the layer of material adhered to and extending over the die stacks. Accordingly, the velocity and pressure of the fluid flow can be maintained at a level that effectively moves the mold material through and completely fills the tunnel, while the flow controller effectively adjusts, across the width of the tunnel, the velocity and pressure to mitigate incursion of the mold material between exposed layers. As a result, the reliability and yield of the semiconductor devices are improved.

In some cases, the flow controller can be substantially rectangular in shape with a thickness, a length extending along the tunnel, and a width extending between, but not interfacing with, the sidewalls. The thickness can vary along portions of the length and width. For example, grooves can be formed along the length proximate the sidewalls. One or more additional groove can be formed in a central region of the flow controller. The portions of the flow controller between the grooves can be thicker than the grooves. The flow controller can be formed in different shapes and sizes to change the pressure and velocity of the mode material as it flows along the sidewalls. The flow controller can be premanufactured and then attached to the surface, or can be directly formed on the surface.

A person skilled in the relevant art will recognize that, unless the context indicates otherwise, structures disclosed herein can be formed using conventional semiconductor manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-4F. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/ below, up/down, and left/right can be interchanged depending on the orientation.

Figure 1B:
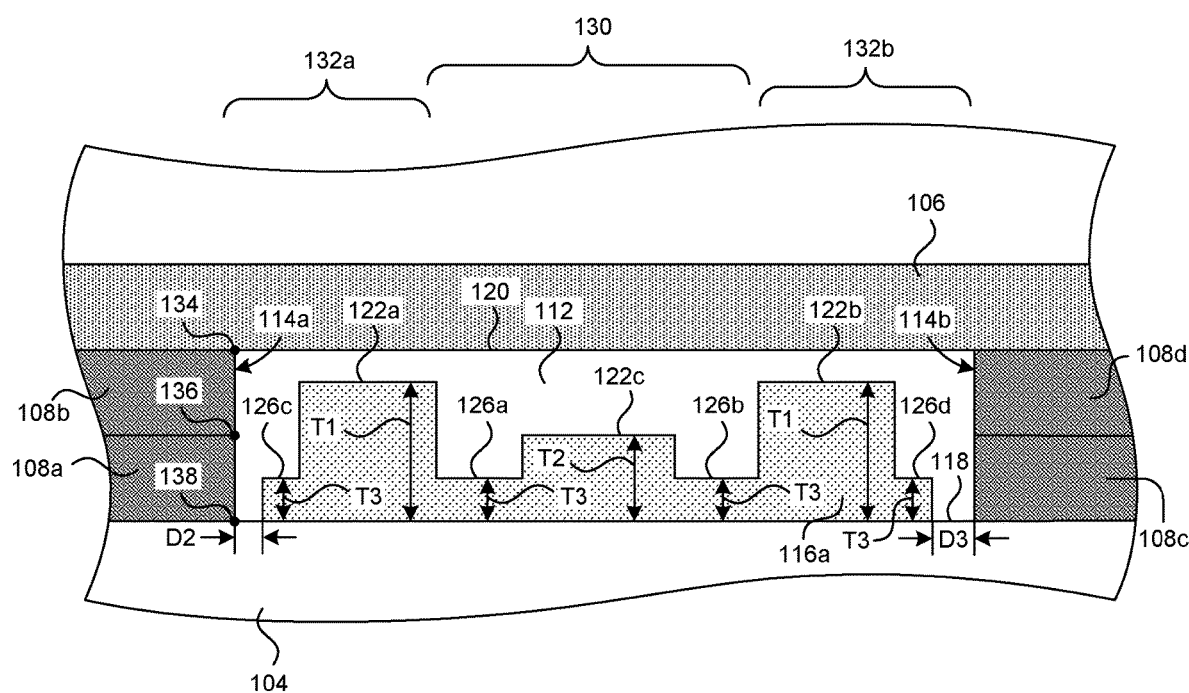
FIG. 1B is a closeup side cross-sectional view of a flow controller inside a tunnel formed between die stacks of the semiconductor package of FIG. 1A.

FIG. 1A illustrates a side cross-sectional view of a semiconductor package 100 configured in accordance with embodiments of the present technology, and FIG. 1B is an enlarged view of a portion of FIG. 1A. The package 100 includes a first die stack 102a and a second die stack 102b mounted on a package substrate 104. The first and second die stacks 102a-b are separated by a distance D1. The first die stack 102a includes a plurality of vertically-stacked semiconductor dies 108a-b (collectively, "first dies 108"). The second die stack 102b includes a plurality of vertically stacked semiconductor dies 108c-d (collectively, "second dies 108"). The first and second dies 108 can be substantially vertically aligned within the die stacks 102. Although the first and second die stacks 102a-b are shown as including two first dies 108 and two second dies 108, respectively, in other embodiments, the die stacks 102a-b can include fewer or more dies 108 (e.g., one, three, four, five, six, seven, or more dies). The first and second die stacks 102a-b can include the same number of dies 108 and/or otherwise have the same or substantially similar heights/thicknesses. In some embodiments, the die stacks 102a-b can be formed on the package substrate 104 by mounting one die 108 at a time.

A lower surface of second substrate 106 (e.g., a silicon spacer, an interposer, a semiconductor die such as DRAM, interposer, logic die, etc.) is coupled, via die attach film or other suitable techniques, to uppermost dies 108 of the first and second die stacks 102a-b. In some embodiments, a third substrate 110 can be mounted on the second substrate 106. Though not shown, additional layer(s) and/or components may be mounted on the third substrate 110, open areas of the second substrate 106 and/or the package substrate 104. For clarity, electrical connections, controllers, and the like are not shown.

An open area or space, herein referred to as tunnel 112, is formed by the package substrate 104, the first and second die stacks 102a-b, and the second substrate 106. The first and second die stacks 102a-b form sidewalls 114a-b (collectively, "sidewalls 114"), respectively, that face the tunnel 112. Although only two die stacks 102 and one tunnel 112 are shown in FIG. 1A, it should be understood that additional die stacks 102 may be used and additional tunnels 112 may be formed.

A flow controller 116a is mounted or formed on the package substrate 104 within the tunnel 112 and partially occludes the tunnel 112. The flow controller 116a is discussed in greater detail below in FIG. 1B. Additional embodiments of the flow controller 116a are discussed below in FIGS. 3A-4F and are collectively referred to as flow controller 116. In some embodiments, the flow controller 116 can be premanufactured (e.g., by etching, machining, etc.) such that it is molded and/or formed separately from the package substrate 104, and then mounted/attached to the package substrate 104. For example, the flow controller 116 can be formed of silicon, glass, or other suitable material. In some cases, the flow controller 116 can be etched or machined. In still further embodiments, the flow controller 116 can be a component or device that is inactive and/or not electrically connected to circuitry of the semiconductor package 100. In some embodiments, the same machine can attach the flow controller 116 onto the package substrate 104 before attaching the dies 108 in the first and second die stacks 102a-b. In other embodiments, the flow controller 116 can be formed directly on the package substrate 104.

In some embodiments, one or more of the die stacks 102 can be arranged in a shingled or stepped configuration in which each die 108 is offset horizontally from the die 108 below. For example, the die stacks 102a-b can be angled away from each other or toward each other, angled in parallel directions, or any other suitable configuration. In this case, the sidewalls 114a-b may not form a vertically aligned surface, but instead, the offset dies would form sidewalls 114a-b that have surfaces that extend different distances into the tunnel 112.

The first and second dies 108 and the second and third substrate 106, 110 can each include a semiconductor substrate (e.g., a silicon substrate, a gallium arsenide substrate, an organic laminate substrate, etc.). In some embodiments, the dies 108 and substrates 106, 110 can each include a front and/or active surface having various types of semiconductor components. For example, the first dies 108 and/or the second dies 108 can each have memory circuits (e.g., dynamic random-access memory (DRAM), static random-access memory (SRAM), flash memory (e.g., NAND, NOR), or other type of memory circuits), controller circuits (e.g., DRAM controller circuits), logic circuits, processing circuits, circuit elements (e.g., wires, traces, interconnects, transistors, etc.), imaging components, and/or other semiconductor features. In other embodiments, the dies 108 can each be arranged in a "face-up" configuration with their front surfaces oriented upward and away from the package substrate 104. In still further embodiments, however, one or more of the dies 108 can be in a "face-down" configuration with their front surfaces oriented downward and toward the package substrate 104. Optionally, one or more of the dies 108 can be a "blank" substrate that does not include semiconductor components and that is formed from, for example, crystalline, semi-crystalline, and/or ceramic substrate materials, such as silicon, polysilicon, aluminum oxide ($Al_2O_3$), sapphire, and/or other suitable materials.

The package substrate 104 can be or include an interposer, a printed circuit board, a dielectric spacer, another semiconductor die (e.g., a logic die), or another suitable substrate. In some embodiments, the package substrate 104 includes additional semiconductor components (e.g., doped silicon wafers or gallium arsenide wafers), nonconductive components (e.g., various ceramic substrates, such as aluminum oxide ($Al_2O_3$), etc.), aluminum nitride, and/or conductive portions (e.g., interconnecting circuitry, TSVs, etc.). The package substrate 104 can further include electrical connectors 142 (e.g., solder balls, conductive bumps, conductive pillars, conductive epoxies, and/or other suitable electrically conductive elements) electrically coupled to the package substrate 104 and configured to electrically couple the package 100 to an external device (not shown).

The package 100 can further include an encapsulant or mold material 140 formed over at least a portion of the package substrate 104 and/or at least partially around the second substrate 106 and third substrate 110 (if present), the first and second die stacks 102a-b, and inside the tunnel 112. In some embodiments, the mold material 140 fully fills an open space within the tunnel 112. The mold material 140 can be a resin, epoxy resin, silicone-based material, polyimide, or any other material suitable for encapsulating the tunnel 112 and at least portions of the other surfaces of the semiconductor package 100 to protect these components from contaminants and/or physical damage. Applying the mold material within the tunnel 112 further increases the mechanical strength of the package 100 and can reduce warpage that may be due to heating during manufacturing and/or operation.

FIG. 1B shows an enlarged side cross-sectional view of the tunnel 112 and the flow controller 116a of FIG. 1A. The package substrate 104 forms a bottom surface 118 of the tunnel 112, and the second substrate 106 forms a top surface 120 of the tunnel 112. The flow controller 116a is positioned a distance D2 from the sidewall 114a and a distance D3 from the sidewall 114b. The distances D2 and D3 can be the same or different and are configured to allow space for the mold material 140 to flow between the flow controller 116 and the sidewalls 114.

The flow controller 116a has a plurality of grooves and protrusions. FIG. 1B illustrates the protrusions and grooves across the width of the flow controller 116a, while FIG. 4A below shows the protrusions and grooves along the length of the flow controller 116a. Referring to FIG. 1B, first and second protrusions 122a-b are located proximate the sidewalls 114a-b and a third protrusion 122c is located in a central area of the flow controller 116a. A groove 126a is formed between the first protrusion 122a and the third protrusion 122c, and another groove 126b is formed between the third protrusion 122c and the second protrusion 122b. Outer grooves 126c-d are formed on outer edges of the flow controller 116a proximate the sidewalls 114a-b. As shown, the first and second protrusions 122a-b each have a thickness T1 that is substantially the same, the third protrusion 122c has a thickness T2 that is less than the thickness T1, and the grooves 126a-d each have a thickness T3 that is substantially the same and is less than the thickness T2. In other embodiments, the flow controller 116a may be formed without the third protrusion 122c. Also, more or fewer numbers of grooves 126 and protrusions 122 may be formed as discussed further below in FIGS. 3A-4F. In other embodiments, the thicknesses T1, T2, and T3 may vary, such that each of the protrusions 122 has a different thickness or the same thickness as another protrusion 122, and each of the grooves 126 has a different thickness or the same thickness as another groove 126. Accordingly, the thicknesses of the protrusions 122 and grooves 126 can vary along the width and/or length of the flow controller 116.

Figure 2:
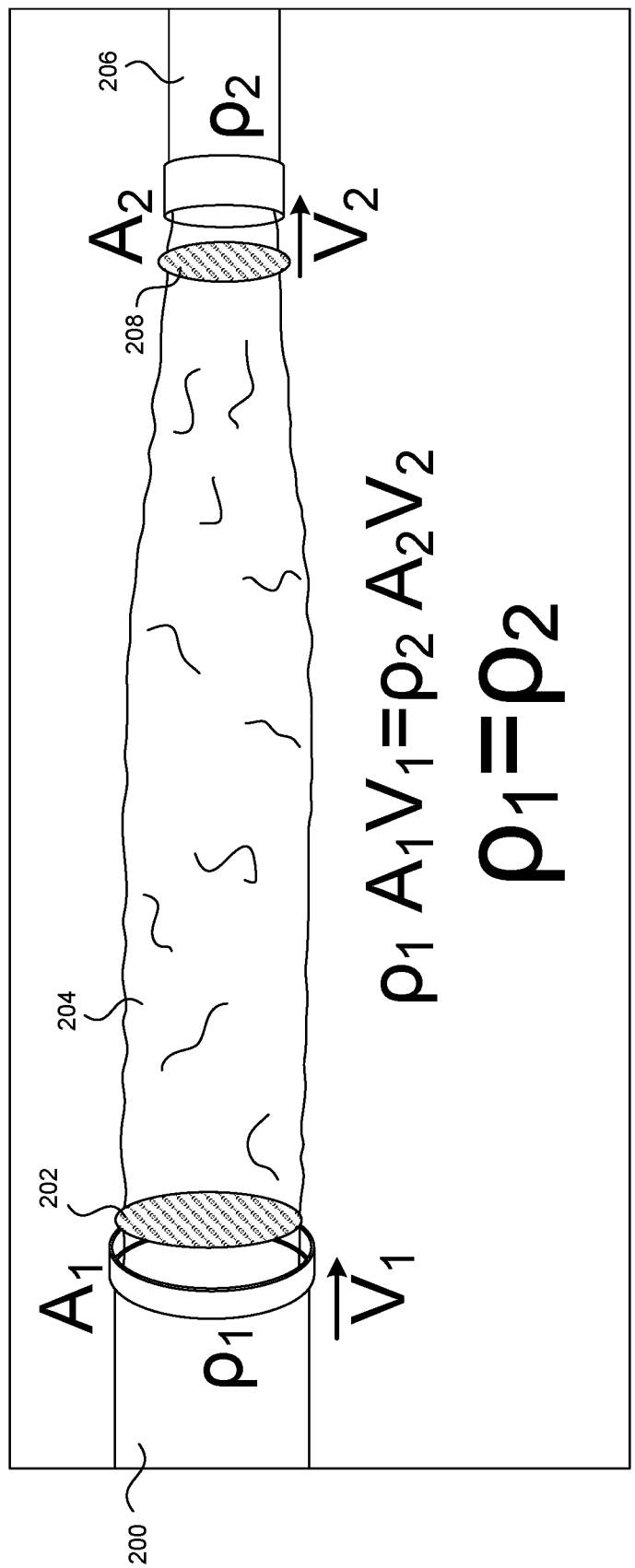
FIG. 2 is an illustration of Bernoulli's Principle in fluid dynamics and the relationship of cross-sectional surface area to pressure and velocity.

The flow controller 116 can change and/or impact the velocity and pressure of the mold material 140 as it flows through the tunnel 112. For example, the protrusions 122 and grooves 126 change the cross-sectional surface area within the tunnel 112 and thus create effective channels or regions within which the mold material 140 has different velocity and pressure as it flows through the tunnel 112. As illustrated in FIG. 2, according to Bernoulli's Principle in fluid dynamics, the relationship between pressure (p), area (A) and velocity (V) can be represented by $p_1 A_1 V_1 = p_2 A_2 V_2$. According to this principle, if area (A) is reduced, the fluid's velocity (V) increases when the pressure (p) remains constant (e.g., when $p_1 = p_2$). FIG. 2 shows a first container 200 that has a first cross-sectional surface area 202. A fluid 204 flows into a second container 206 with a second cross-sectional surface area 208 that is smaller than the first cross-sectional surface area 202 while the pressure (p) used to transmit the fluid 204 remains the same. Specifically, reducing or decreasing the cross-section of the surface area (A) can increase the fluid velocity (V) and decrease the fluid pressure (p) of the fluid 204 moving through the second container 206.

Returning to FIG. 1B, the differing thicknesses T1-T3 across the width of the flow controller 116 can change the fluid dynamics within the tunnel 112 such that the mold material 140 (not shown) flows at a relatively slower, higher pressure flow in a central region 130 (e.g., where the flow controller 116a is smaller, resulting in a relatively larger cross-sectional surface area) and a relatively higher velocity, lower pressure flow in two side regions 132a-b (e.g., wherein the flow controller 116a is larger, resulting in a relatively smaller cross-sectional surface area). In other words, the side regions 132 have a smaller volume of open area or a higher percentage of occlusion within the tunnel 112 compared to the central region 130. Having a slower, higher pressure flow in the central region 130 allows additional mold material 140 to flow along the left and right side regions 132a-b as needed at a faster, lower pressure flow that mitigates the higher pressure that causes ingress and delamination as discussed below, while maintaining other settings and parameters used to apply the mold material 140. The central region 130 and side regions 132 are generally indicated on FIG. 1B. However, it should be understood that there will be variabilities in the velocity and pressure of the mold material 140 across and at the junction of the indicated regions.

The decrease in pressure of the mold material 140 as it flows alongside the sidewalls 114a-b of the die stacks 102a-b can decrease and/or eliminate the ingression of the mold material 140 between the joined layers that are exposed along the sidewalls 114a-b. For example, along the sidewall 114a, at high velocity the mold material 140 may ingress between the second substrate 106 and the die 108b at point 134, between the dies 108a and 108b at point 136, and/or between the die 108a and the package substrate 104 at point 138. Therefore, the size of the side regions 132a-b can be adjusted, by changing the cross-sectional surface area within the tunnel 112, to decrease or increase the flow velocity along the sidewalls 114a-b, ensuring that the mold material 140 fully fills the tunnel 112 while eliminating or decreasing the ingression of the mold material 140 between layers in the sidewalls 114a-b.

Figure 3A:
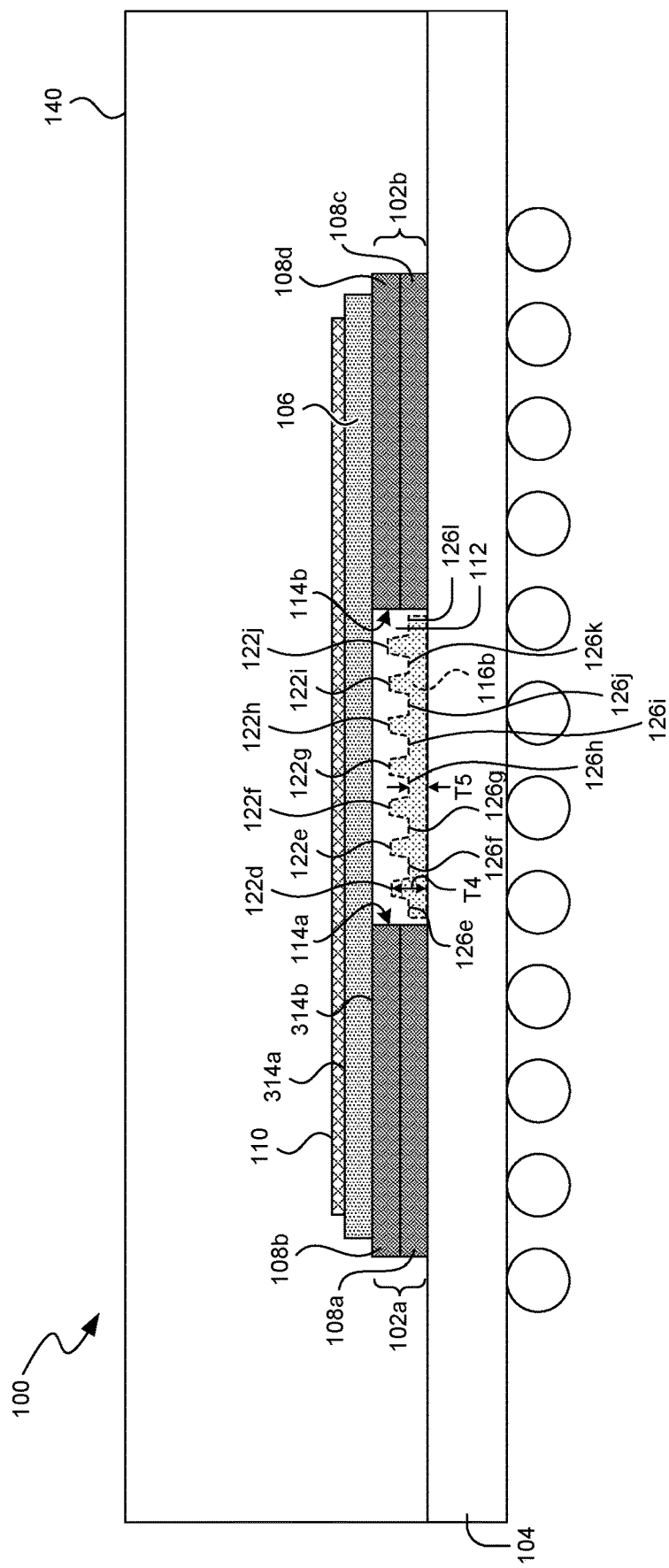
FIGS. 3A and 3B are side cross-sectional views of different configurations of flow controllers inside the tunnel formed between the die stacks of the semiconductor package in accordance with embodiments of the present technology.
Figure 3B:
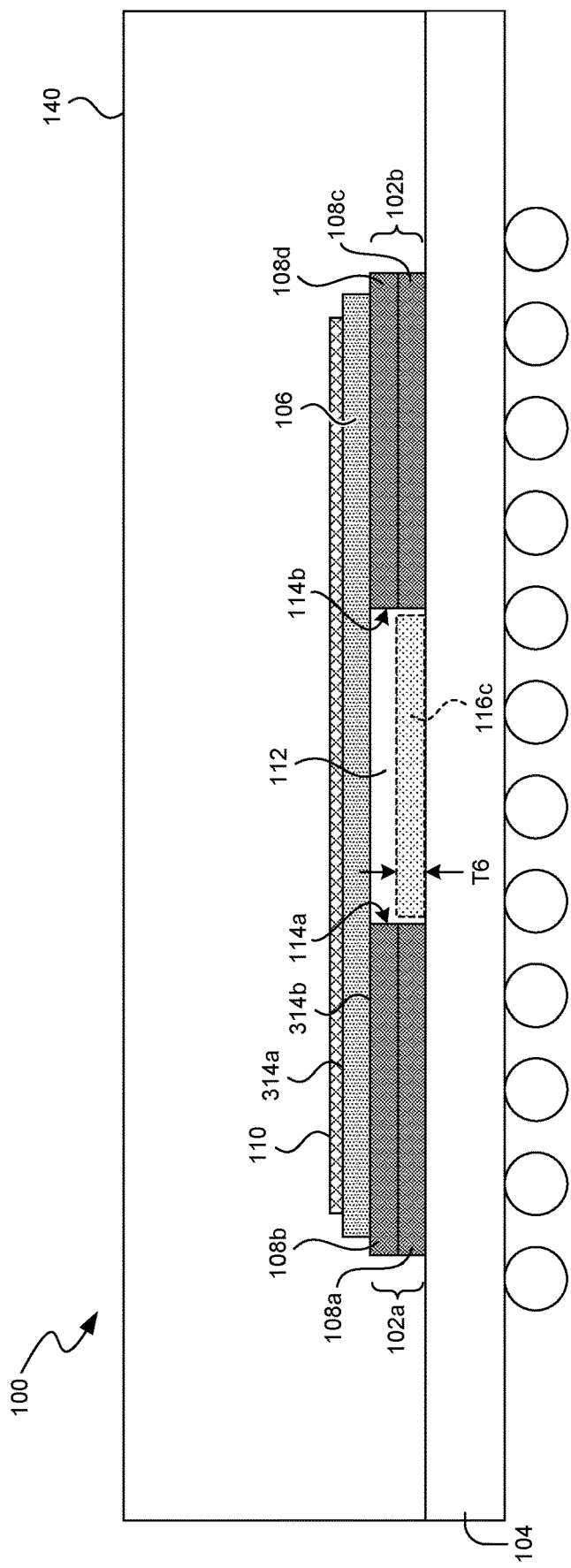

FIGS. 3A and 3B show two different embodiments of flow controllers 116 that can be used to change the fluid dynamics within the tunnel 112. Like item numbers with FIGS. 1A and 1B are used. In FIG. 3A, the flow controller 116b has a plurality of protrusions 122d-j and a plurality of grooves 126e-1 and is a distance away from the sidewalls 114 (such as distance D2, D3 shown in FIG. 1B). In comparison with the flow controller 116a shown in FIG. 1A, the flow controller 116b has more grooving structures (e.g., protrusions 122 and grooves 126). As shown, a thickness T4 of each of the protrusions 122d-j is substantially the same and a thickness T5 of each of the grooves 126e-1 is substantially the same and is less than the thickness T4. However, the thicknesses T4 and T5 can vary. In contrast with the flow controller 116a shown in FIGS. 1A and 1B, the protrusions 122d-j and grooves 126e-1 form a plurality of channels or regions (not shown) that each have approximately the same flow pressure and velocity. The flow controller 116b evenly distributes the fluid pressure across the width of the tunnel 112 and mitigates pressure effects of the mold material 140 along the sidewalls 114a-b.

In some embodiments, the flow controller 116b with the structure shown in FIG. 3A can be used in a package 100 wherein at least one of a width and length of the tunnel 112 is greater than the width and length of the tunnel 112 shown in FIG. 1B. In some cases, the number of grooves 126 in a flow controller 116 can be increased as the length of the tunnel 112 increases.

Turning to FIG. 3B, the flow controller 116c within the tunnel 112 decreases the cross-sectional surface area of the tunnel 112, and thus increases the velocity and decreases the pressure of the mold material 140 as it flows through the tunnel 112. The flow controller 116c is substantially rectangular in shape and has a substantially uniform thickness T6. The flow controller 116c is a distance away from the sidewalls 114a-b (such as distance D2, D3 shown in FIG. 1B), allowing the mold material 140 to flow between the flow controller 116 and the sidewalls 114.

Figure 4A:
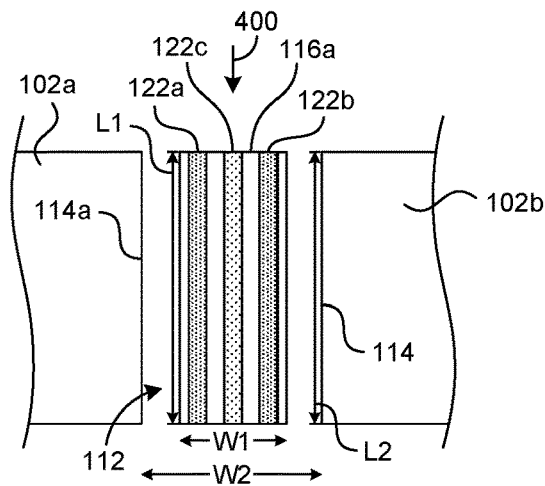
FIGS. 4A-4F are top views illustrating different configurations of flow controllers inside the tunnel formed between the die stacks of the semiconductor package in accordance with embodiments of the present technology.

FIGS. 4A-4F show different embodiments of the flow controller 116 that can be used to change the fluid dynamics within the tunnel 112. FIG. 4A shows a top-down view of the flow controller 116a of FIG. 1. The protrusions 122 are indicated. The flow controller 116a is substantially rectangular in shape, having a width W1 and length L1. The flow controller 116a extends substantially a length L2 of the tunnel 112 and across a portion of a width W2 of the tunnel 112. An arrow indicates direction of fluid flow 400 of the mold material 140. As discussed previously, the fluid dynamics of the mold material 140 are altered by the flow controller 116a that changes the cross-sectional surface area within different regions of the tunnel 112, increasing the velocity and decreasing the pressure in areas near the sidewalls 114a-b.

In general, any size or shape of flow controller 116 can be used to reduce the cross-sectional surface area of the tunnel 112, as long as the cross-sectional surface area is still sufficient to allow the mold material 140 to flow through the tunnel 112. For example, the size and shape of the flow controller 116 can be based on the length, width, and height of the tunnel 112. In some embodiments, the flow controller 116 can have a width W1 of approximately 750 μm, although other widths can be used. If the first and second die stacks 102a-b each include two dies 108, the thickness (indicated as T1 in FIG. 1B) of the flow controller 116 can be approximately 190 μm, and if the first and second die stacks 102a-b each include three dies 108, the thickness T1 (FIG. 1B) can be approximately 300 μm. The length L1 of the flow controller 116 can be based, at least in part, on the length L2 of the tunnel 112. In other embodiments, if the length L2 is greater than or equal to approximately 5,000 μm, the length L1 of the flow controller 116 can be at least approximately 5,000 μm, while if the length L2 is greater than or equal to approximately 7,000 μm, the length L1 of the flow controller 116 can be up to approximately 7,865 μm. For example, both the width and length of the flow controller 116b (FIG. 3A) may be greater than the width and length of the flow controller 116a (FIG. 1B). In other embodiments, the length L1 of the flow controller 116 can be larger than, the same or approximately the same as, or less than the length L2 of the tunnel 112. If should be understood that although different lengths, widths, and thicknesses are indicated, the embodiments contemplated herein are not so limited.

Figure 4B:
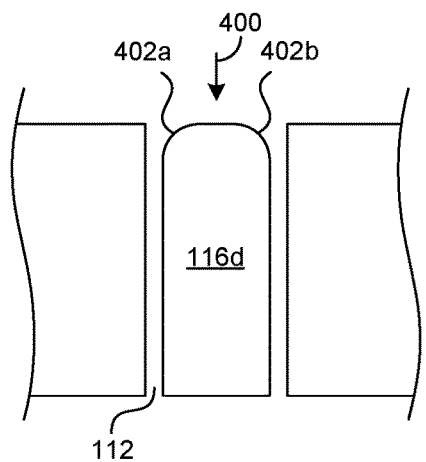
Figure 4C:
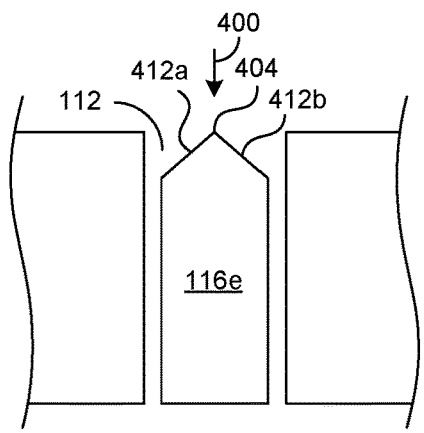

FIGS. 4B and 4C illustrate top-down views of flow controllers 116d-e that extend substantially the length L2 of the tunnel 112 and are generally rectangular in shape. In FIG. 4B, a first end of the flow controller 116d has rounded corners 402a-b at an end closest to the entering fluid flow 400, while in FIG. 4C, the flow controller 116e has notched corners 412a and 412b and a tapered point 404 at an end closest to the entering fluid flow 400.

Figure 4D:
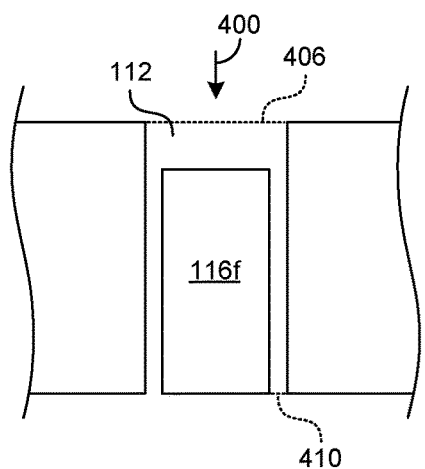

FIG. 4D illustrates another embodiment wherein flow controller 116f does not extend the entire length L2 of the tunnel 112. Although the flow controller 116f is inset into the tunnel 112 away from tunnel edge 406 and approximately in-line with an opposite tunnel edge 410, the flow controller 116f can be positioned in other locations within the tunnel 112. For example, the flow controller 116f can be set substantially in-line with the tunnel edge 406, centered equally between the tunnel edges 406 and 410, or positioned closer to one of the tunnel edges 406, 410 than the other.

Figure 4E:
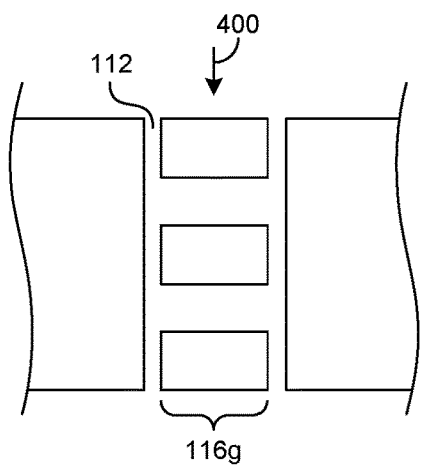
Figure 4F:
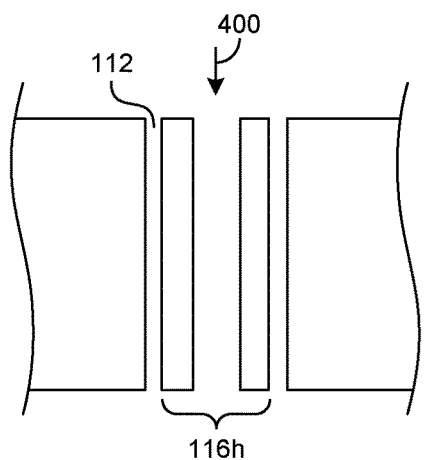

FIGS. 4E and 4F illustrate embodiments wherein the flow controller 116 can be segmented, including more than one separate piece of material. In FIG. 4E, the flow controller 116g includes three separate pieces that are arranged along the length L2 of the tunnel 112. The pieces of the flow controller 116g can be equally spaced with respect to each other, offset, equal to one or both of the tunnel edges, and/or the same or different distances from the sidewalls 114. There can be more or less than three separate pieces (e.g., two, four, five, six, etc. separate pieces). The flow controller 116h of FIG. 4F includes two pieces that extend along the length L2 of the tunnel 112. As shown, the two pieces extend substantially the entire length L2 of the tunnel 112. However, one or both of the two pieces can extend partially along the length L2 of the tunnel 112, can be positioned closer together or further apart, and/or can be positioned to be in contact with each other along their lengths. Also, this embodiment can include more than two pieces, such as three, four, five, etc., pieces.

Other configurations of the flow controller 116 are possible, such as blunted ends, rounded ends, ramps, etc. The flow controller 116 can be substantially symmetrical along the width W1, as shown in FIGS. 1B and 4A, or asymmetrical along its width W1. Further, the flow controller 116 can be symmetrical or asymmetrical along its length L1.

Although not shown, in other embodiments the flow controller 116 can be any piece of material or surface mounted component(s), such as one or more capacitors, resistors, inductors, and/or other devices that are positioned within the tunnel. The surface mounted component(s) may be passive and used solely as a flow controller 116 and not interconnected with circuitry within the semiconductor package 100.

Referring again to FIGS. 1A and 1B, the semiconductor package 100 can be manufactured using any suitable process known to those of skill in the art. In some embodiments, for example, a manufacturing process for the package 100 includes mounting or forming the flow controller 116 on the package substrate 104, and then mounting the first and second die stacks 102a-b. Alternatively, the process could mount or form the flow controller 116 on the package substrate 104 after or simultaneously with mounting the first and second die stacks 102a-b and/or dies 108a, 108c. The second substrate 106 can be mounted on the first and second die stacks 102a-b (e.g., via die attach film or other suitable techniques). After the flow controller 116, dies 108, and/or other components are mounted and/or mechanically and electrically coupled, the mold material 140 can be applied. In other embodiments, the flow controller 116 can be adhered to the second substrate 106 and configured to extend into the tunnel 112 toward the package substrate 104.

Any one of the semiconductor devices and/or packages having the features described above with reference to FIGS. 1A, 1B, and 3A-4F can be incorporated into any of a myriad of larger and/or more complex systems (not shown). The system can include a processor, a memory (e.g., SRAM, DRAM, flash, and/or other memory devices), input/output devices, and/or other subsystems or components. The flow controller 116 described above with reference to FIGS. 1A-4F can be included. The resulting system can be configured to perform any of a wide variety of suitable computing, processing, storage, sensing, imaging, and/or other functions. Accordingly, representative examples of the system include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system include lights, cameras, vehicles, etc. With regard to these and other examples, the system can be housed in a single unit or distributed over multiple interconnected units, e.g., through a communication network. The components of the system can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the technology is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a package substrate having first and second surfaces;
   a first die stack formed on the first surface;
   a second die stack formed on the first surface adjacent to the first die stack, wherein a portion of the first surface extends between the first and second die stacks;
   a layer of material adhered to top surfaces of the first and second die stacks, wherein the layer of material extends at a distance above the portion of the first surface between the first and second die stacks to form a tunnel between the layer of material, opposing sidewalls of the first and second die stacks and the first surface of the package substrate; and
   a flow controller adhered to at least a portion of the first surface inside the tunnel, the flow controller reducing a cross-sectional surface area of at least a portion of the tunnel.

2. The semiconductor device of claim 1, further comprising mold material encapsulating exposed surfaces of the first and second die stacks, exposed surfaces of the flow controller, exposed surfaces of the layer of material, and exposed surfaces of the package substrate.

3. The semiconductor device of claim 1 wherein the flow controller is substantially rectangular in shape with respect to a length and width of the tunnel.

4. The semiconductor device of claim 1 wherein the flow controller has at least one portion that is thicker than a second portion.

5. The semiconductor device of claim 1 wherein the flow controller includes at least three protrusions that have a thickness that is greater than a second thickness of at least two grooves, wherein the at least three protrusions are alternately positioned with the at least two grooves across a width of the flow controller.

6. The semiconductor device of claim 1 wherein the flow controller extends substantially a length of the tunnel.

7. The semiconductor device of claim 1 wherein the flow controller includes:
   first and second grooves proximate the sidewalls of the first and second die stacks; and
   at least one protrusion located between the first and second grooves, wherein the at least one protrusion has a first thickness that is greater than thicknesses of the first and second grooves.

8. The semiconductor device of claim 3 wherein the flow controller further includes:
   first and second grooves extending along at least a portion of a length of the flow controller proximate the sidewalls of the first and second die stacks;
   first and second protrusions extending along at least a portion of the length of the flow controller proximate the first and second grooves, respectively, the first and second protrusions having first and second thicknesses that are greater than thicknesses of the first and second grooves;
   a third protrusion extending along at least a portion of the length of the flow controller and positioned between the first and second protrusions, wherein the third protrusion has a third thickness that is less than the first and second thicknesses and greater than the thicknesses of the first and second grooves;
   a third groove extending along at least a portion of the length of the flow controller between the first and third protrusions; and
   a fourth groove extending along at least a portion of the length of the flow controller between the second and third protrusions, the third and fourth grooves having thicknesses that are less than the third thickness of the third protrusion.

9. The semiconductor device of claim 1 wherein the flow controller has a width extending in a direction between the first and second sidewalls, and wherein the flow controller is substantially symmetrical along its width.

10. The semiconductor device of claim 1 wherein the flow controller is configured to reduce a fluid pressure and increase a fluid velocity of mold material along the sidewalls of the first and second die stacks within the tunnel when the mold material is applied to encapsulate the device.

11. The semiconductor device of claim 1 wherein the first and second die stacks include at least one memory die.

12. The semiconductor device of claim 1 wherein the flow controller is premanufactured or formed on the first surface of the package substrate.

13. The semiconductor device of claim 1 wherein the flow controller comprises silicon or glass.

* * * * *